(12) United States Patent
Bian et al.

(10) Patent No.: US 6,605,537 B2
(45) Date of Patent: Aug. 12, 2003

(54) POLISHING OF METAL SUBSTRATES

(75) Inventors: Jinru Bian, Newark, DE (US); Tirthankar Ghosh, Oreland, PA (US); Terence M. Thomas, Newark, DE (US)

(73) Assignee: Rodel Holdings, Inc., Wilmington, DE (US)

( * ) Notice: Subject to any disclaimer, the term of this patent is extended or adjusted under 35 U.S.C. 154(b) by 0 days.

(21) Appl. No.: 10/043,664

(22) Filed: Oct. 26, 2001

(65) Prior Publication Data

US 2002/0106897 A1 Aug. 8, 2002

Related U.S. Application Data

(63) Continuation-in-part of application No. 09/956,680, filed on Sep. 20, 2001, now abandoned.
(60) Provisional application No. 60/243,973, filed on Oct. 27, 2000.

(51) Int. Cl.$^7$ .............................................. H01L 21/302
(52) U.S. Cl. ...................... 438/691; 438/692; 438/693; 438/694; 438/697
(58) Field of Search ................................. 438/692, 693, 438/700, 691, 694, 697

(56) References Cited

U.S. PATENT DOCUMENTS 6,326,299 B1 * 12/2001 Homma et al. ............. 438/633
6,348,076 B1 * 2/2002 Canaperi et al. ............. 51/309

FOREIGN PATENT DOCUMENTS

| EP | 0 913 442 | 5/1999 |
| EP | 0 913 442 A2 | 5/1999 |
| EP | 1 211 717 A1 | 6/2002 |
| EP | 1 223 609 A1 | 7/2002 |
| JP | 2000150435 A | 5/2000 |
| WO | WO 01/14496 | 3/2001 |

OTHER PUBLICATIONS

Steigerwald, Joseph M.; Murarka, Shyam P.; Gutmann, Ronald J.; Chemical Mechanical Planarization of Microelectronic Materials, 1997, pp. 220–222, John Wiley & Sons, Inc. New York, N.Y. US.

Luo, Q et al.: "Copper Dissolution and Chemical–Mechanical Polishing in Acidic Media"; Electrochemical Society Proceedings, Electrochemical Society, Pennington, NJ, US; vol. 97–31, 1998, pp. 73–83.

Kondo, S et al: "Chemical Mechanical Polishing of Copper Using Silica Slurry", Electrochemical Society Proceedings, Electrochemical Society, Pennington, NJ, US vol. 98–6, May 4, 1998, pp. 195–205.

* cited by examiner

Primary Examiner—Benjamin L. Utech
Assistant Examiner—Binh X. Tran
(74) Attorney, Agent, or Firm—Gerald K. Kita; Blake T. Biederman

(57) ABSTRACT

A method of polishing a semiconductor substrate by adjusting the polishing composition with a BTA concentration that raises the metal removal rate when polishing at a relatively high polishing pressure, and that minimizes the metal removal rate when polishing metal in trough at a lower polishing pressure; and adjusting the polishing pressure on metal in each trough to a level that removes metal from trough at a minimized removal rate, while simultaneously polishing the excess metal with a higher polishing pressure.

1 Claim, 2 Drawing Sheets

POLISHING OF METAL SUBSTRATES

CROSS-REFERENCE TO RELATED APPLICATIONS

This application is a continuation in part of application Ser. No. 09/956,680 filed on Sep. 20, 2001 and Provisional Application Serial No. 60/243,973 filed on Oct. 27, 2000.

FIELD OF THE INVENTION

The invention relates to a method for polishing a semiconductor substrate by Chemical Mechanical Polishing (CMP) to remove excess metal from surface of the substrate.

DESCRIPTION OF RELATED ART

CMP is used to planarize semiconductor substrates. In CMP, a polishing pad is pressed against the substrate and is moved across the surface of substrate while an aqueous liquid polishing composition (also referred to as slurry) is provided between the polishing pad and the substrate. The CMP process is a combination of chemical action and mechanical action. Chemicals in the polishing composition carry out the chemical action while the necessary mechanical action is provided by the movement of the substrate against the polishing pad. Abrasive particles when present in the polishing slurry enhance the mechanical action. An oxidizer when present in the composition converts the metal on the substrate to oxide which is then removed by movement of the substrate against the polishing pad. A metal oxide sometimes serves as an element of a passivating layer. Thus formation of the metal oxide layer the rate of metal removal during the polishing process.

A known polishing process by CMP removes excess metal from an underlying surface of the substrate, and polishes such surface to a smooth planar surface. The known polishing operation begins by polishing with a relatively high polishing pressure, for example, 5 psi, to remove excess metal at a relatively high removal rate, followed by polishing with a relatively reduced polishing pressure, for example, 3 psi, to remove a residual thin film of the excess metal from an underlying surface, and to polish the surface to a smooth polished planar surface.

Copper is a relatively soft metal in comparison to the substrate of the semiconductor wafer that usually is silica or another similar hard substrate. By using conventional polishing equipment and techniques, a copper circuit on a patterned wafer is polished more in the center than on the edges. This phenomenon is commonly known as dishing.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To minimize dishing, polishing is performed at a lower polishing pressure. However, merely reducing the polishing pressure would require that polishing continue for a lengthened duration. However, dishing would continue to be produced for the entire lengthened duration. What is needed is a method to minimize dishing of metal in trenches or troughs without lengthening the duration of the polishing operation.

SUMMARY OF THE INVENTION

The method of this invention provides for minimal dishing of metal in a trench or a trough on a semiconductor substrate by adjusting the polishing pressure exerted on the semiconductor substrate and utilizing an aqueous polishing composition having an adjusted concentration of an aromatic triazole during the CMP process.

BRIEF DESCRIPTION OF THE DRAWING

Embodiments of this invention will now be described by way of example with reference to the accompanying drawings.

DETAILED DESCRIPTION

Figure 2:
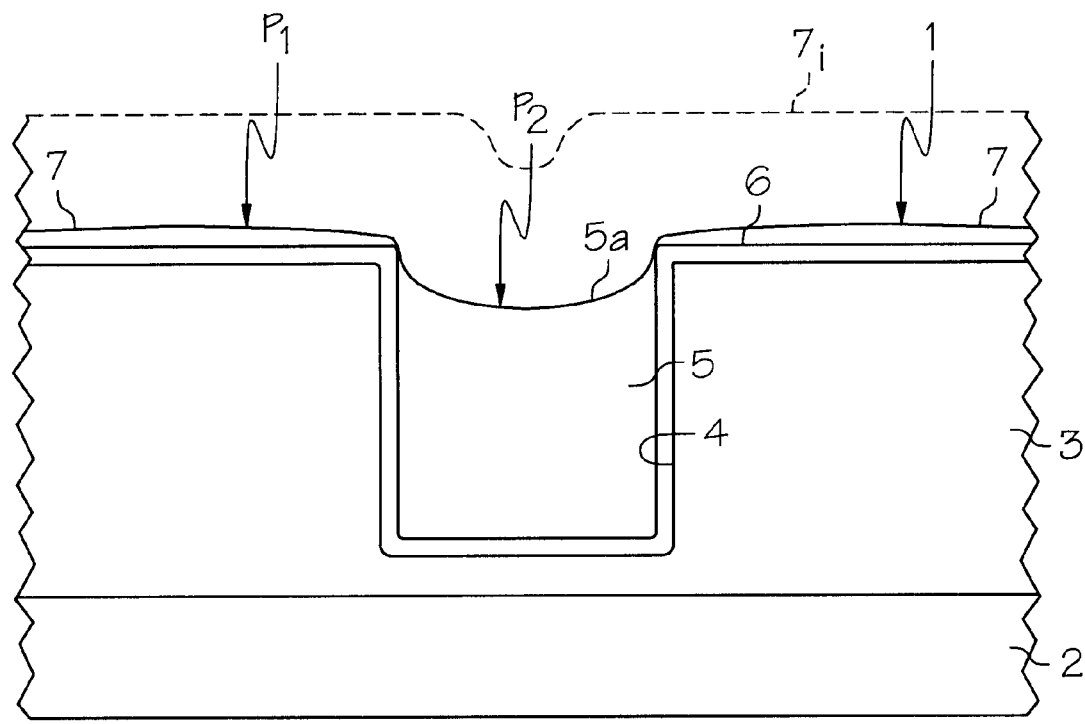
FIG. 2 is a schematic view of a portion of a semiconductor substrate shown in cross section.

With reference to FIG. 2, polishing by CMP removes a thickness of excess metal 7, such as, copper, for example, from a surface of a semicoductor substrate 1. According to a known CMP operation, polishing pressure is exerted by and between a surface of the semiconductor substrate 1 and a moving polishing pad, while the substrate 1 is held with a downforce against the polishing pad, during polishing of the surface of the substrate 1 by CMP, and while a fluid polishing composition is present at an interface between the surface of the substrate 1 and a polishing surface of the polishing pad.

Figure 1:
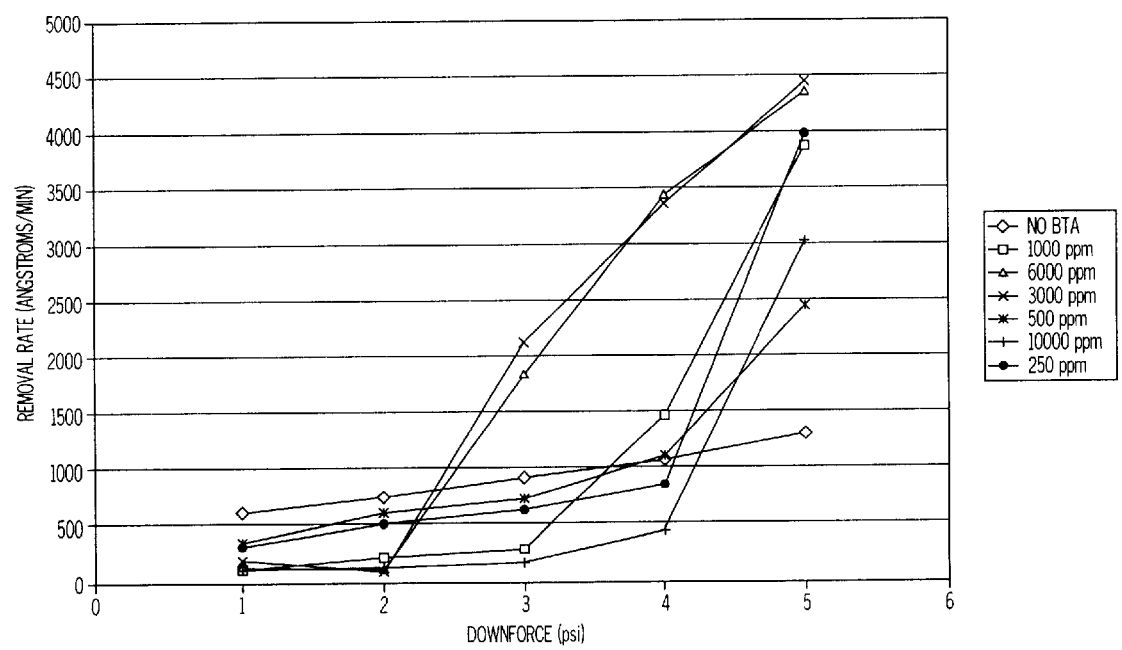
FIG. 1 is a graph disclosing the rate at which metal is removed (Removal rate) as a function of polishing pressure (or downforce) during the CMP process.

FIG. 1 discloses different graphs. Each graph discloses the metal removal rate of the excess metal 7, indicated by the caption "removal rate",in units Angstroms per minute, versus polishing pressure, indicated by the caption "Downforce" in units of psi, pounds per square inch, when a surface area of substrate 1 is polished by CMP.

Further, each graph disclosed by FIG. 1, discloses how the metal "removal rate " of excess metal 7, such as, excess copper metal, varing polishing pressure "Downforce", and a polishing composition having different concentrations in ppm, parts per million, BTA in solution, when a surface area of a substrate 1 is polished by CMP.

A known process of CMP is to polish a semiconductor substrate 1 with a relatively high polishing pressure, for example, 5 psi, to remove excess metal 7 at a relatively high removal rate. The polishing pressure of 5 psi, corresponding metal removal rate is shown as a point along each different graph in FIG. 1. For example, with reference to FIG. 1, a graph corresponding to "No BTA" has a plotted point, at a "Downforce" of 5 psi, and at a high "removal rate" between 1000 Angstrom per minute and 1500 Angstroms per minute.

FIG. 1, discloses that the same "removal rate" is attained by a point on the graph corresponding to "10000 ppm" BTA concentration, at a "Downforce" of approximately 4.3 psi. Thus, a surprising result of adding 10000 ppm of BTA concentration to the polishing composition is, that a lower polishing attains the same high removal rate as is attained with a higher polishing pressure and with a polishing composition having "no BTA" concentration. The invention adds a BTA concentration of "10000 ppm" to the polishing composition,to obtain the same relatively high removal rate of excess metal 7 when polishing with a lower polishing pressure, 4.3 psi, as compared to polishing with a higher polishing pressure 5.0 psi and using a polishing composition without the BTA concentration. One advantage is, that pad wear is reduced by polishing at the lower polishing pressure.

Further, by adding 10000 ppm of BTA concentration to the polishing composition, the removal rate of excess metal 7 by CMP polishing is higher that the removal rate obtained by polishing in the presence of a polishing composition without the BTA concentration at a downforce greater than 4.5 psi.

Further, the known polishing operation is followed by the process of, reducing the polishing pressure to a relatively reduced polishing pressure, for example, 3 psi, and polishing at the reduced polishing pressure for a duration that is sufficient to remove residual thin films of the excess metal 7 from an underlying surface of the substrate 1, and to polish such surface to a smooth planar polished surface.

One of the problems to be overcome is that the known polishing operation tends to remove metal from each trench or trough 4, causing recessed dishing of the metal in each trench or trough 4. Excess dishing is undesirable for causing variations in the critical dimensions of the copper metal line forming a copper metal circuit.

To minimize dishing of the metal in each trough 4, it is desirable to polish with a relatively reduced polishing pressure, which minimizes the removal rate of the metal in each trench or trough 4. However, merely reducing the polishing pressure would require a lengthened duration of the polishing time required to be completely remove the excess metal 7. Further, such dishing would continue to be produced for the entire lengthened duration of the polishing time. What is needed is a method of polishing to minimize dishing of metal in trenches or trough 4 during removal of excess metal 7 by polishing by CMP.

It is desired to polish a semiconductor wafer to remove excess metal 7 from the surface of a semiconductor substrate 1 at a relatively high removal rate. It is further desired to remove the metal in trenches or troughs 4 at a minimized removal rate, which would minimize dishing of the metal in each trenches or trough 4. For the purpose of describing the invention, the graphs according to FIG. 1 indicate that a removal rate is minimized by attaining a removal rate of less than 500 Angstroms per minute.

With reference to FIG. 1, the graph corresponding to "10000 ppm" BTA concentration, indicates that, at a polishing pressure of 4 psi and lower, the metal "removal rate" is less than 500 Angstroms per minute, i.e., a minimized removal rate. The graph confirms that, when polishing by CMP, using a polishing composition with 10000 ppm of BTA concentration in aqueous solution, and a polishing pressure of 4 psi and lower, the removal rate is less than 500 Angstroms per minute, which is considered to be a minimized removal rate. Such a result is surprising, when compared to the graph corresponding to "No BTA", which indicates by a point on the graph, that when the polishing pressure is lowered to approximately 1 psi, the corresponding metal "removal rate" is approximately 600 Angstroms per minute, and remains a relatively high removal rate.

The graph corresponding to "10000" ppm BTA concentration has a steep slope, when the polishing pressure is lowered to 4 psi from 4.3 psi, which indicates that the metal "removal rate" decreases steeply relative to a decrease in "Downforce" polishing pressure. The steep slope of the graph indicates that a small reduction in the "Downforce" polishing pressure from 4.3 psi to 4 psi will steeply reduce a relatively high metal "removal rate," in a range between 1000 and 1500 Angstroms per minute, to a minimized "removal rate," 500 Angstroms per minute and less.

As disclosed by FIG. 1, other graphs corresponding to different BTA concentrations indicate similarly surprising results. For example, the steep slope of the graph corresponding to "1000 ppm" BTA concentration in a polishing composition, indicates that a small reduction in the "Downforce" polishing pressure from 3.8 psi to 3.0 psi will steeply reduce a relatively high metal "removal rate," between 1000 and 1500 Angstroms per minute, to the minimized "removal rate," 500 Angstroms per minute and less.

Polishing by CMP will be further described with reference to FIG. 2. FIG. 2 discloses a cross section of a semiconductor substrate 1 that has undergone polishing by CMP. With reference to FIG. 2, the substrate 1 includes a base of silicon 2 covered by a dielectric layer 3 in which is recessed a trough 4 or tench, one of multiple troughs 4 or trenches. A thin barrier film 6 of metal covers the dielectric layer 3, including each trough 4. Metal 5, such as copper metal, is deposited to fill each trough 4, and provide a copper metal circuit. Excess copper metal 7 covers the surface of the underlying barrier film 6, and is intended to be removed by polishing by CMP.

The excess metal 7 is removed by chemical reaction with a fluid polishing composition, and by polishing friction applied by a known polishing pad that is used in performing a process of CMP. The desired result of CMP is to polish the semiconductor substrate 1 to remove the excess metal 7, and leave the metal 5 in each trough 4 without excessive dishing 5a. One of the problems to be overcome, is that polishing by CMP removes metal 5 from each trough 4, causing recessed dishing 5a of the metal 5 in each trough 4. Excessive dishing 5a is adverse to the critical dimensions of the copper metal circuit. In the past, polishing with a relatively higher polishing pressure to remove excess metal 7 at a high removal rate, would cause dishing 5a. Further, lowering the polishing pressure would require a lengthened polishing time to remove the excess metal 7. Unless the polishing pressure was lowered to a level that would remove metal 5 at a minimized removal rate, polishing for a lengthened polishing time might cause excessive dishing 5a.

The invention provides a method to remove excess metal 7 at a high removal rate, while minimizing dishing 5a. For an understanding of the invention, different polishing pressures will now be discussed. As disclosed by FIG. 2, during polishing by CMP, pressure applied by a known polishing pad exerts a downforce P1 against a peak on the surface of the excess metal 7 to be removed by polishing. The pressure applied by the polishing pad exerts a corresponding pressure that applies a downforce P2 against the metal 5 in each trough 4, which is one factor that causes dishing 5a. FIG. 2 discloses the excess metal 7 having an initial thickness 7i indicated by a broken object line. When polishing pressure initiates or commences on the the excess metal 7 of initial thickness 7i, the commencing polishing pressure P2i on the metal 5 in each trough 4 is nearly the same as the commencing polishing pressure P1i on the initial thickness 7i of the excess metal 7 to be removed by polishing, because no dishing 5a has occurred. However, as polishing continues, dishing 5a begins to occur, and becomes more recessed, with the dished metal 5 in each trough 4 becoming more recessed farther away from the polishing pad, which lowers the force P2, on the dished metal 5, to become less than the force P1 on the excess metal 7 that is at a higher elevation. Due, in part, to the relationship, P2<P1, during polishing, the removal rate for the dished metal 5 at a lower elevation and being polished by the application of polishing pressure P2, is less than the removal rate for the excess metal 7 that is at a higher elevation than the metal 5, and is being polished by the application of polishing pressure P1.

A test is performed by polishing the substrate 1 with a selected BTA concentration in a polishing composition, and with an adjusted polishing pressure P1 that removes excess metal 7, and that provides a polishing pressure P2 to cause dishing 5a; followed by, continuing to polish until the metal 5 is recessed to a depth that causes a reduction of the polishing pressure P2 to a level that consequently reduces the removal rate of the metal 5. Polishing continues until the excess metal 7 is removed completely. If the metal 5 has undergone excessive dishing 5a, then the test indicates that the adjusted polishing pressure P1 is too high. The object of performing the test is to find an adjusted polishing pressure P1 that can continue unchanged througout a polishing operation, during which polishing operation, the dishing 5a of the metal 5 lowers the elevation of the metal 5 to a recessed level at which the polishing pressure P2 is reduced sufficiently to minimize the removal rate of the metal 5, as the polishing pressure P1 continues to remove excess metal 7 at a relatively higher removal rate. By repeating the test with a lower polishing pressure P1, a test will be found that will provide an adjusted polishing pressure P1 that can continue unchanged throughout a polishing operation to completely remove excess metal 7 at a relatively high removal rate, and to minimize the dishing 5a within an acceptable limit by minimizing the removal rate of the dished metal 5.

According to an advantage of the invention, adding a BTA concentration in a polishing composition will lower the metal removal rate of metal in troughs 4 being polished by CMP with a relatively low polishing pressure.

According to another advantage of the invention, adding a BTA concentration in a polishing composition will raise the metal removal rate of excess metal 7 being polished by CMP with a relatively higher polishing pressure.

The invention includes, a method of polishing a semiconductor substrate 1, by adding a BTA concentration in the polishing fluid to minimize the metal removal rate when polishing with a lower polishing pressure, and to raise the metal removal rate when polishing with a relatively higher polishing pressure.

The invention includes, polishing metal in trough 4 with a relatively low polishing pressure while simultaneously polishing excess metal 7 at a higher elevation than the metal in trough 4, adding a BTA concentration in the polishing composition, to minimize the metal removal rate of the dished metal 5 when the dished metal 5 is polished with the relatively low polishing pressure, and to raise the metal removal rate of the excess metal 7 being polished.

Further the invention includes, adjusting the polishing pressure to apply a relatively low polishing pressure to the dished metal 5 during polishing, which minimizes the metal removal rate of the dished metal 5 during polishing, while simultaneously polishing the excess metal 7 at a higher polishing pressure to remove the excess metal 7 at a metal removal rate that is raised by the addition of BTA to the polishing composition.

The invention further includes, applying a polishing pressure against the substrate 1, and adjusting the polishing pressure such that the higher polishing pressure is applied to the excess metal 7, while the lower polishing pressure is applied to the dished metal 5, thereby removing the excess metal 7 at a relatively high removal rate during polishing, while simultaneously removing dished metal 5 at a minimized removal rate during polishing.

The invention provides a concentration of BTA in a polishing composition that is used during CMP, which narrows the difference between a relatively high polishing pressure that produces a high removal rate and a lower polishing pressure that produces a minimized removal rate.

A method according to the invention includes, adding a BTA concentration to a polishing composition to raise the metal removal rate when polishing with a higher polishing pressure, and to lower the metal removal rate to a minimized removal rate when polishing with a lower polishing pressure, applying a polishing pressure to the metal in trough 4, which minimizes the removal rate of the metal in trough 4, and simultaneously applying a polishing pressure to the excess metal 7 at a higher elevation than metal in trough 4, which removes the excess metal 7 at a raised metal removal rate.

An embodiment of the invention comprises the steps of, adding BHT concentration to a polishing composition, and polishing a semiconductor substrate 1 in the presence of the polishing composition at an interface between the substrate 1 and a polishing pad, and with a substantially constant, adjusted polishing pressure P1 that removes excess metal 7 at a relatively high rate of removal, while causing increased dishing 5a of metal 5 in troughs 4, followed by, continuing to polish with the substantially constant, adjusted polishing pressure P1 until the metal 5 becomes increasingly recessed by increased dishing 5a, which lowers the polishing pressure P2 on the metal 5 below a polishing pressure P2 that minimizes the metal removal rate of the metal 5.

Although embodiments of the invention are disclosed, other embodiments and modifications of the invention are intended to be covered by the spirit and scope of the appended claims.

What is claimed is:

1. A method of polishing a semiconductor substrate by chemical mechanical planarization, using a polishing pad and a polishing composition to remove excess metal from the substrate, comprising the steps of:

introducing the polishing composition to the substrate, the polishing composition having benzotriazole concentration that raises a metal removal rate; and polishing with the polishing pad at a first polishing pressure that raises the metal removal rate and a second polishing pressure, that lowers the metal removal rate when polishig metal in a trough at the polishing pressure, the first polishihg pressure being greater than the second polishing pressure; and the polishing pressure from the polishing pad on metal in the trough being the second polishing pressure that removes metal from the trough at a lower removal rate, while the polishing simultaneously removes the excess metal with the first polishing pressure to remove excess metal at a raised removal rate.

* * * * *